US 9,000,875 B2

(12) United States Patent
McBee et al.

(10) Patent No.: US 9,000,875 B2
(45) Date of Patent: Apr. 7, 2015

(54) APPARATUS AND METHOD FOR MOUNTING AN OVERHEAD DEVICE

(75) Inventors: Bruce W. McBee, Brookfield, WI (US); Gregg James Haensgen, Menomonee Falls, WI (US); John Fredrick Banting, Waukesha, WI (US); William J. Kostolni, Crivitz, WI (US); Bryan C. Cochran, Lakeville, MN (US)

(73) Assignee: Cooper Technologies Company, Houston, TX (US)

( * ) Notice: Subject to any disclaimer, the term of this patent is extended or adjusted under 35 U.S.C. 154(b) by 105 days.

(21) Appl. No.: 13/205,812

(22) Filed: Aug. 9, 2011

(65) Prior Publication Data

US 2012/0039061 A1    Feb. 16, 2012

Related U.S. Application Data

(60) Provisional application No. 61/372,360, filed on Aug. 10, 2010.

(51) Int. Cl.
*H01F 38/20* (2006.01)
*H01F 38/28* (2006.01)
(Continued)

(52) U.S. Cl.
CPC .............. *H01F 38/30* (2013.01); *H01F 27/06* (2013.01)

(58) Field of Classification Search
CPC .................. G01R 15/18; G01R 15/186; G01R 19/16547; G01R 31/025; H04B 2203/5433; H04B 3/54; H04B 3/56; H01F 27/06; H01F 2038/305
USPC .................. 336/174, 175, 173; 324/126, 127; 340/664; 361/42, 62, 63, 3.9; 323/355, 323/357, 358
See application file for complete search history.

(56) References Cited

U.S. PATENT DOCUMENTS 2,273,534 A * 2/1942 Mitchell .......................... 336/98
2,953,757 A * 9/1960 Yarrick et al. .................. 336/65
3,025,512 A    3/1962 Bloechl
(Continued)

FOREIGN PATENT DOCUMENTS

EP          0589729 A2    3/1994
FR          2717582 A1    9/1995
WO     WO 2007/143378 A2   12/2007

OTHER PUBLICATIONS

Spectrum, The Institute of Electrical and Electronic Engineers, Inc., "New Ways to Play, Electronic Music Interfaces," Dec. 1997, 3 pages.
Cooper Power Systems, Fault Indicators, S.T.A.R.™, Faulted Circuit Indicators, Electrostatic Reset Type, Electrical Apparatus 320-60, May 1997, 4 pages.

(Continued)

*Primary Examiner* — Alexander Talpalatski
*Assistant Examiner* — Joselito Baisa
(74) *Attorney, Agent, or Firm* — King & Spalding LLP (57) ABSTRACT

An apparatus is provided for securing to and collecting power from an electrical conductor including a wire clamp that clamps to and secures the apparatus to the electrical conductor, a current transformer ("CT") that clamps to the electrical conductor and collects power from the electrical conductor, and a housing including a cavity that encloses circuitry associated with the apparatus. According to various aspects, the circuitry may include one or more sensors and wireless communications circuitry, and the CT may include a core and an electrical winding that receives an induced current from magnetic flux generated according to alternating current present on the electrical conductor.

11 Claims, 8 Drawing Sheets

(51) Int. Cl.
*H01F 38/30* (2006.01)
*H01F 27/06* (2006.01)

(56) References Cited

U.S. PATENT DOCUMENTS

| | | | |
|---|---|---|---|
| 3,253,215 A * | 5/1966 | Moakler et al. | 324/529 |
| 3,364,481 A | 1/1968 | Fuzzell | |
| 3,386,032 A * | 5/1968 | Medlar | 324/127 |
| 3,460,038 A | 8/1969 | Ziegler | |
| 3,700,967 A | 10/1972 | Hoss | |
| 3,720,872 A | 3/1973 | Russell et al. | |
| 3,725,846 A | 4/1973 | Strain | |
| 3,735,248 A | 5/1973 | Reese | |
| 3,816,816 A | 6/1974 | Schweitzer, Jr. | |
| 3,995,243 A | 11/1976 | Malmborg | |
| 4,000,462 A | 12/1976 | Boyd et al. | |
| 4,037,155 A | 7/1977 | Ahmed | |
| 4,045,726 A | 8/1977 | Schweitzer, Jr. | |
| 4,157,520 A | 6/1979 | Moates et al. | |
| 4,165,528 A | 8/1979 | Schweitzer, Jr. | |
| 4,288,743 A | 9/1981 | Schweitzer | |
| 4,335,437 A | 6/1982 | Wilson et al. | |
| 4,384,289 A | 5/1983 | Stillwell et al. | |
| 4,456,873 A | 6/1984 | Schweitzer, Jr. | |
| 4,466,042 A | 8/1984 | Zylstra et al. | |
| 4,495,489 A | 1/1985 | Schweitzer, Jr. | |
| 4,510,476 A | 4/1985 | Clatterbuck et al. | |
| 4,558,310 A | 12/1985 | McAllise | |
| 4,593,276 A | 6/1986 | Aida et al. | |
| 4,630,218 A | 12/1986 | Hurley | |
| 4,661,813 A | 4/1987 | Mazzamauro et al. | |
| 4,686,518 A | 8/1987 | Schweitzer, Jr. | |
| 4,694,599 A | 9/1987 | Hart et al. | |
| 4,739,149 A | 4/1988 | Nishiwaki et al. | |
| 4,746,241 A | 5/1988 | Burbank, III | |
| 4,758,962 A | 7/1988 | Fernandes | |
| 4,794,328 A | 12/1988 | Fernandes et al. | |
| 4,794,329 A * | 12/1988 | Schweitzer, Jr. | 324/127 |
| 4,794,332 A | 12/1988 | Schweitzer, Jr. | |
| 4,795,982 A | 1/1989 | Schweitzer, Jr. | |
| 4,799,005 A | 1/1989 | Fernandes | |
| 4,801,937 A | 1/1989 | Fernandes | |
| 4,839,600 A * | 6/1989 | Kuurstra | 324/127 |
| 4,847,780 A | 7/1989 | Gilker et al. | |
| 4,881,028 A | 11/1989 | Bright | |
| 4,886,980 A | 12/1989 | Fernandes et al. | |
| 4,984,124 A | 1/1991 | Yeh | |
| 5,029,039 A | 7/1991 | Yeh | |
| 5,095,274 A | 3/1992 | Brokaw | |
| 5,140,257 A | 8/1992 | Davis | |
| 5,155,440 A | 10/1992 | Huang | |
| 5,159,319 A | 10/1992 | Dunk et al. | |
| 5,220,311 A | 6/1993 | Schweitzer, Jr. | |
| 5,241,444 A | 8/1993 | Yeh | |
| 5,258,903 A | 11/1993 | Rodriguez-Cavazos | |
| 5,341,088 A | 8/1994 | Davis | |
| 5,397,982 A | 3/1995 | Van Lankvelt | |
| 5,426,360 A | 6/1995 | Maraio et al. | |
| 5,440,234 A | 8/1995 | Kondo | |
| 5,475,371 A | 12/1995 | Dunk et al. | |
| 5,485,545 A | 1/1996 | Kojima et al. | |
| 5,497,096 A | 3/1996 | Banting | |
| 5,537,327 A | 7/1996 | Snow et al. | |
| 5,548,279 A | 8/1996 | Gaines | |
| 5,559,500 A | 9/1996 | Kase | |
| 5,574,387 A | 11/1996 | Petsche et al. | |
| 5,576,632 A | 11/1996 | Petsche et al. | |
| 5,629,870 A | 5/1997 | Farag et al. | |
| 5,630,954 A | 5/1997 | Toth | |
| 5,650,728 A | 7/1997 | Rhein et al. | |
| 5,661,626 A | 8/1997 | Takeuchi | |
| 5,675,497 A | 10/1997 | Petsche et al. | |
| 5,714,886 A | 2/1998 | Harris | |
| 5,726,847 A | 3/1998 | Dalstein | |
| 5,734,575 A | 3/1998 | Snow et al. | |
| 5,754,383 A | 5/1998 | Huppertz et al. | |
| 5,784,233 A | 7/1998 | Bastard et al. | |
| 5,796,631 A | 8/1998 | Iancu et al. | |
| 5,805,400 A | 9/1998 | Kim | |
| 5,945,820 A | 8/1999 | Namgoong et al. | |
| 5,959,537 A | 9/1999 | Banting et al. | |
| 6,344,748 B1 | 2/2002 | Gannon | |
| 6,535,797 B1 | 3/2003 | Bowles et al. | |
| 6,538,797 B1 | 3/2003 | Hunt | |
| 6,587,027 B1 | 7/2003 | Nadd | |
| 6,677,743 B1 | 1/2004 | Coolidge et al. | |
| 6,687,574 B2 | 2/2004 | Pietrowicz et al. | |
| 6,798,211 B1 | 9/2004 | Rockwell et al. | |
| 6,815,932 B2 | 11/2004 | Wall | |
| 6,963,226 B2 | 11/2005 | Chiang | |
| 7,010,437 B2 | 3/2006 | Lubkeman et al. | |
| 7,256,701 B2 | 8/2007 | Kono et al. | |
| 7,274,186 B2 | 9/2007 | Yakymyshyn et al. | |
| 7,282,944 B2 | 10/2007 | Gunn et al. | |
| 7,312,603 B2 | 12/2007 | Luo et al. | |
| 7,312,686 B2 | 12/2007 | Bruno | |
| 7,382,272 B2 | 6/2008 | Feight | |
| 7,398,097 B2 | 7/2008 | Parkulo | |
| 7,453,267 B2 | 11/2008 | Westbrock, Jr. et al. | |
| 7,495,574 B2 | 2/2009 | Rocamora et al. | |
| 7,518,529 B2 | 4/2009 | O'Sullivan et al. | |
| 7,557,563 B2 | 7/2009 | Gunn et al. | |
| 7,576,548 B1 | 8/2009 | Lo et al. | |
| 7,609,158 B2 | 10/2009 | Banting et al. | |
| 7,692,538 B2 | 4/2010 | Schweitzer, III et al. | |
| 7,714,735 B2 | 5/2010 | Rockwell | |
| 7,733,094 B2 | 6/2010 | Bright et al. | |
| 7,733,224 B2 | 6/2010 | Tran | |
| 7,746,241 B2 | 6/2010 | Feight et al. | |
| 7,777,605 B2 * | 8/2010 | Zumoto et al. | 336/178 |
| 7,864,012 B2 * | 1/2011 | Merck et al. | 336/175 |
| 7,868,776 B2 | 1/2011 | Kesler et al. | |
| 7,930,141 B2 | 4/2011 | Banting | |
| 7,956,763 B2 | 6/2011 | Mies | |
| 8,342,494 B2 | 1/2013 | Ricci et al. | |
| 8,395,372 B2 * | 3/2013 | Harlev et al. | 324/96 |
| 8,441,817 B2 | 5/2013 | Pääjärvi | |
| 8,536,857 B2 | 9/2013 | Nero, Jr. | |
| 2004/0183522 A1 | 9/2004 | Gunn et al. | |
| 2005/0017751 A1 | 1/2005 | Gunn et al. | |
| 2005/0146220 A1 | 7/2005 | Hamel et al. | |
| 2005/0151659 A1 | 7/2005 | Donovan et al. | |
| 2006/0063522 A1 | 3/2006 | McFarland | |
| 2006/0187074 A1 | 8/2006 | O'Sullivan et al. | |
| 2006/0279910 A1 | 12/2006 | Gunn et al. | |
| 2007/0059986 A1 | 3/2007 | Rockwell | |
| 2007/0086135 A1 | 4/2007 | Swartzendruber et al. | |
| 2007/0136010 A1 | 6/2007 | Gunn et al. | |
| 2007/0285201 A1 | 12/2007 | Zumoto et al. | |
| 2008/0077336 A1 | 3/2008 | Fernandes | |
| 2008/0284585 A1 | 11/2008 | Schweitzer, III et al. | |
| 2009/0015239 A1 | 1/2009 | Georgiou et al. | |
| 2009/0115426 A1 | 5/2009 | Muench, Jr. et al. | |
| 2009/0231764 A1 | 9/2009 | Banting et al. | |
| 2010/0013457 A1 | 1/2010 | Nero, Jr. | |
| 2010/0085036 A1 | 4/2010 | Banting et al. | |

OTHER PUBLICATIONS

Cooper Power Systems, Fault Indicators, S.T.A.R.™ Faulted Circuit Indicators, Low Voltage Reset Type, Electrical Apparatus 320-50, May 1997, 4 pages.

Cooper Power Systems, Fault Indicators, S.T.A.R.™ Faulted Circuit Indicators, Test Point Reset Type, Electrical Apparatus 320-40, May 1997, 4 pages.

Cooper Power Systems, Fault Indicators, S.T.A.R.™ Type ER Faulted Circuit Indicator, Installation Instructions, Service Information, S320-60-1, Dec. 1997, 2 pages.

Cooper Power Systems, Fault Indicators, S.T.A.R.™ Type LV Faulted Circuit Indicator, Installation Instructions, Service Information S320-50-1, May 1997, 4 pages.

Cooper Power Systems, Fault Indicators, S.T.A.R.™ Type TPR Faulted Circuit Indicator, Installation Instructions, Service Information S320-40-1, Dec. 1997, 3 pages.

(56) References Cited

OTHER PUBLICATIONS

Cooper Power Systems, S.T.A.R.™ Faulted Circuit Indicators, Low Voltage Reset Type, Bulletin No. 97035, Jan. 1998, 2 pages.
Cooper Power Systems, S.T.A.R.™ Faulted Circuit Indicators, Test Point Reset Type, Bulletin No. 97034, Jan. 1998, 2 pages.
The International Search Report and Written Opinion for corresponding PCT international patent application No. PCT/US2011/047016, mailed Dec. 7, 2011 (7 pages).
"Examination Report from the Intellectual Property Office" dated Jan. 2, 2012, including Search Report, for related Taiwanese patent application No. 09614009 (5 pages).
"Research for Structure of Wireless Sensor Networks based on power transmission hallway", Peng Zheng et al., Engineering Journal of Wuhan University, vol. 39, No. 3, Jun. 30, 2006, pp. 12-16, cited in office action dated Nov. 9, 2011 for related Chinese patent application No. 200780048163.5 (6 pages).

\* cited by examiner

APPARATUS AND METHOD FOR MOUNTING AN OVERHEAD DEVICE

CROSS-REFERENCE TO RELATED APPLICATIONS

This application claims the benefit of U.S. Provisional Application No. 61/372,360, filed Aug. 10, 2010, entitled "Mounting Methods for Overhead Device," the entire contents of which is hereby incorporated herein by reference. This application is related to U.S. patent application Ser. No. 11/982,588, entitled "Communicating Faulted Circuit Indicator Apparatus and Method of Use Thereof," filed Nov. 2, 2007; U.S. patent application Ser. No. 12/569,343, entitled "Overhead Communicating Device," filed on Sep. 29, 2009; U.S. patent application Ser. No. 12/569,446, entitled "Power Line Energy Harvesting Power Supply," filed on Sep. 29, 2009; U.S. patent application Ser. No. 13/205,824, entitled "Apparatus and Method for Mounting an Overhead Monitoring Device," filed on Aug. 9, 2011; and U.S. patent application Ser. No. 13/205,829, entitled "Apparatus for Mounting an Overhead Monitoring Device," filed on Aug. 9, 2011. The complete disclosure of each of the foregoing priority and related applications are hereby fully incorporated herein by reference.

TECHNICAL FIELD

The present invention generally relates to power line monitoring devices, reliably securing a power line monitoring device to a power line, and reliably powering a power line monitoring device by inductive coupling from a power line.

BACKGROUND

Modern electrical power distribution systems include many independent devices that measure and control the distribution of power from power generating facilities to meter access points. Typically, a "transmission system" transports power from a power generation facility to a substation, and a "distribution system" distributes the generated power from the substation to an end point. The transmission and distribution systems may each include one or more "monitoring devices" that measure, monitor, and/or control power flow. For example, a monitoring device may include a faulted circuit indicator ("FCI"), a current sensor, and/or a voltage sensor that measure, monitor, and/or control power flow on a power line conductor of a transmission or distribution system.

It is desirable to communicate information measured by a monitoring device to a remote facility, such as an automatic metering infrastructure (AMI), where it can be analyzed along with information measured by other monitoring devices. To this end, monitoring devices may include wireless communication radios, for example, to wirelessly communicate measured information. Thus, monitoring devices require a power source to supply power to circuitry associated with wireless communication. However, when placed upon a conductor of a distribution system, a power source is not generally available to a monitoring device. Traditional approaches to powering monitoring devices have involved the use of batteries or solar cells, which have a limited lifetime and are unreliable and expensive. Batteries have limited power and cannot provide the ongoing power required monitoring devices on power lines. Solar cells can replenish power in storage devices, but are unreliable due to contamination, weather, snow, and other factors.

Further, a monitoring device should include a means to be securely attached to a power line, even in varying environmental conditions throughout the calendar year. Additionally, it would be desirable for a monitoring device to be configured such that it may be secured to a power line by a field technician without de-energizing the power line, to minimize disruptions in electrical service distribution.

Therefore, a need exists in the art for an improved monitoring device having a means to be reliably secured to a power line and further including a suitable power source.

SUMMARY

An apparatus is provided for securing to and collecting power from an electrical conductor, including a wire clamp that clamps to and secures the apparatus to the electrical conductor, a current transformer ("CT") that clamps to the electrical conductor and collects power from the electrical conductor, and a housing including a cavity that encloses circuitry associated with the apparatus. Among aspects, the circuitry may include one or more sensors and wireless communications circuitry, and the CT may include a core and an electrical winding that receives an induced current from magnetic flux generated according to alternating current present on an electrical conductor.

In other aspects, an apparatus may include a circuit configured to convert induced current into energy to be stored for consumption by sensors and wireless communications circuitry, and the apparatus may include a CT comprising first and second magnetic core sections, the first and second magnetic core sections being integrated with the apparatus to be separable. The apparatus may also include one or more springs to spring bias first and second magnetic core sections to a closed position, an adjustment rod that secures an electrical conductor based on rotation, and a ground point electrically coupled to the electrical conductor.

In other aspects, an apparatus is provided for securing to and collecting power from an electrical conductor, including a housing including an internal cavity, a top cover that secures and covers a top core of a split core current transformer ("CT"), a bottom cover that that secures and covers a bottom core of the split core CT, and a wire clamp that clamps to and secures the apparatus to the electrical conductor, and an arm that adjoins the housing, the top cover, and the bottom cover.

In other aspects, an apparatus may include a CT rod fastened to a bottom cover at one end and passing through a CT rod spring and a through-hole in an arm, wherein the CT rod spring surrounds the CT rod between the arm and the bottom cover and provides a spring bias that maintains top and bottom cores of a CT in a closed position and another end of the CT rod includes an adjustment eye for moving the CT rod against a spring bias to open top and bottom cores of a CT. In other aspects, an apparatus may include a wire clamp rod passing through a through-hole in a wire clamp, and a tooth fastened at one end of the wire clamp rod for securing an electrical conductor by the wire clamp, wherein another end of the wire clamp rod includes an adjustment eye for twisting the wire clamp rod to un-secure the apparatus from the electrical conductor.

In other aspects, an apparatus may include a top cover including a post extending from one side, a wire clamp including a post through-hole, wherein the post of the top cover is disposed through the post through-hole of the wire clamp to fasten the wire clamp to the top cover, wherein the wire clamp is formed to pivot about the post of the top cover with respect to the top cover, a bottom cover, a housing, and an arm.

In other aspects, an apparatus may include circuitry disposed in an internal cavity of a housing that converts current induced in a winding into power for sensing and measuring conditions of an electric conductor, wherein the conditions include a fault condition, and the circuitry disposed in the internal cavity of the housing includes a ground point electrically coupled to the electrical conductor.

A method is provided for securing to and collecting power from an electrical conductor, including adjusting a current transformer ("CT") clamp rod to open a CT, positioning the CT to a position resting upon the electrical conductor, adjusting a wire clamp rod to open a wire clamp, and positioning the wire clamp and wire clamp rod such that the wire clamp clamps the electrical conductor, wherein the wire clamp and the CT comprise elements of a monitoring device, the monitoring device includes a housing including an internal cavity, a top cover that covers a top core of the CT, a bottom cover that covers a bottom core of the CT, and an arm that adjoins the housing, the top cover, and the bottom cover.

BRIEF DESCRIPTION OF THE DRAWINGS

For a more complete understanding of the invention and the advantages thereof, reference is now made to the following description, in conjunction with the accompanying figures briefly described as follows.

DETAILED DESCRIPTION

The present invention is directed to a monitoring device that can be easily secured to a power line without de-energizing or compromising the integrity of the power line. According to the present invention, a monitoring device including a current transformer ("CT") that captures energy via magnetic flux from the power line is secured to a power line. Circuitry associated with the CT converts the energy captured by the CT into energy that may be used by one or more electrical circuits and devices. For example, the energy may power one or more microcontrollers, sensors, wireless communication devices, and/or other circuitry and devices.

The one or more sensors of the monitoring device monitor and collect information related to the power line. For example, the sensors may collect information regarding a current on the power line, a voltage on the power line, a temperature of the power line, and/or information regarding whether a vibration is present on the power line. Among embodiments of the present invention, the one or more wireless communications devices communicate at least a portion of the collected information to a remote location. For example, the information can be communicated to an AMI of a central utility company associated with the power line and/or monitoring device.

In one aspect, the circuitry associated with the monitoring device may include a ground reference point electrically coupled to the power line when the power line monitoring device is secured to the power line. Thus, embodiments of the present invention may include coupling the monitoring device to a ground reference point via a coupling to a power line. In this embodiment, the monitoring device and associated circuitry of the monitoring device maintains a voltage potential of the power line as a ground or reference voltage. Accordingly, a substantially equalized or uniform electric field is present around the monitoring device. As compared to a monitoring device without the equalized and uniform electric field, a monitoring device relying on a power line as a ground or reference voltage is able to conduct wireless communications with reduced noise and interference.

A voltage potential of the monitoring device may be substantially different than a voltage potential of a power line prior to securing the monitoring device to the power line. As such, certain embodiments of the present invention include a pad of semi-conductive material disposed between the power line and the monitoring device to slow a rate of change of the difference in voltage potential between the power line and the monitoring device, when securing the monitoring device to the power line. Slowing down the rate of change can minimize the risk of corona discharge upon securing and/or electrically coupling the monitoring device to the power line.

In certain embodiments of the invention, the CT of the monitoring device includes two "split core" sections which allow the CT to be easily installed having a power line extending through the CT without de-energizing the power line. At least one of the split core sections includes an electrical wire winding wrapped around the section. Thus, when the CT is mounted in proximity to a power line, an alternating magnetic flux field caused by an alternating current conducted by the power line couples to the CT and the electrical wire winding of the CT. An induced current is thus generated in the electrical wire winding of the CT, which can be converted into power for circuitry associated with the monitoring device.

To obtain power from the induced current generated in the electrical winding of the CT, the circuitry associated with the monitoring device may include a pre-regulator circuit that receives the induced current from the CT and develops a voltage matched to a power curve of the CT. In this case, an output of the pre-regulator is coupled to a switching regulator that regulates the voltage to an output voltage suitable for the circuitry associated with the monitoring device, such as a wireless communications device or other device. The circuitry may also include an energy storage device, such as a rechargeable battery or a supercapacitor, that provides power to the circuitry when the power line does not carry an adequate alternating current to induce an adequate current in the electrical wire winding of the CT.

The monitoring device and its associated circuitry are designed to withstand harsh environments and provide reliable operation. For example, the CT may be protected by a housing, epoxy coating, or other means. In addition, a housing of the circuitry associated with the monitoring device may be designed to protect the circuitry and other components from the environment. At least some of the components of the monitoring device may be constructed from materials suitable to withstand exposure to rain, ice, snow, sun, wind, and other environmental conditions.

According to certain aspects of the present invention, a monitoring device is designed such that it may be securely attached to a power line by a field technician without de-energizing the power line. That is, the monitoring device may be attached to the power line using only a hotstick without de-energizing the power line and interrupting power distribution services. Further, the monitoring device of the present invention is designed to provide a secure attachment to the power line, so that it is unlikely that the monitoring device would be unsecured from the power line due to wind, rain, hail, or other environmental conditions.

Turning now to the drawings, in which like numerals indicate like elements throughout, embodiments of the present invention are described in additional detail.

Figure 1:
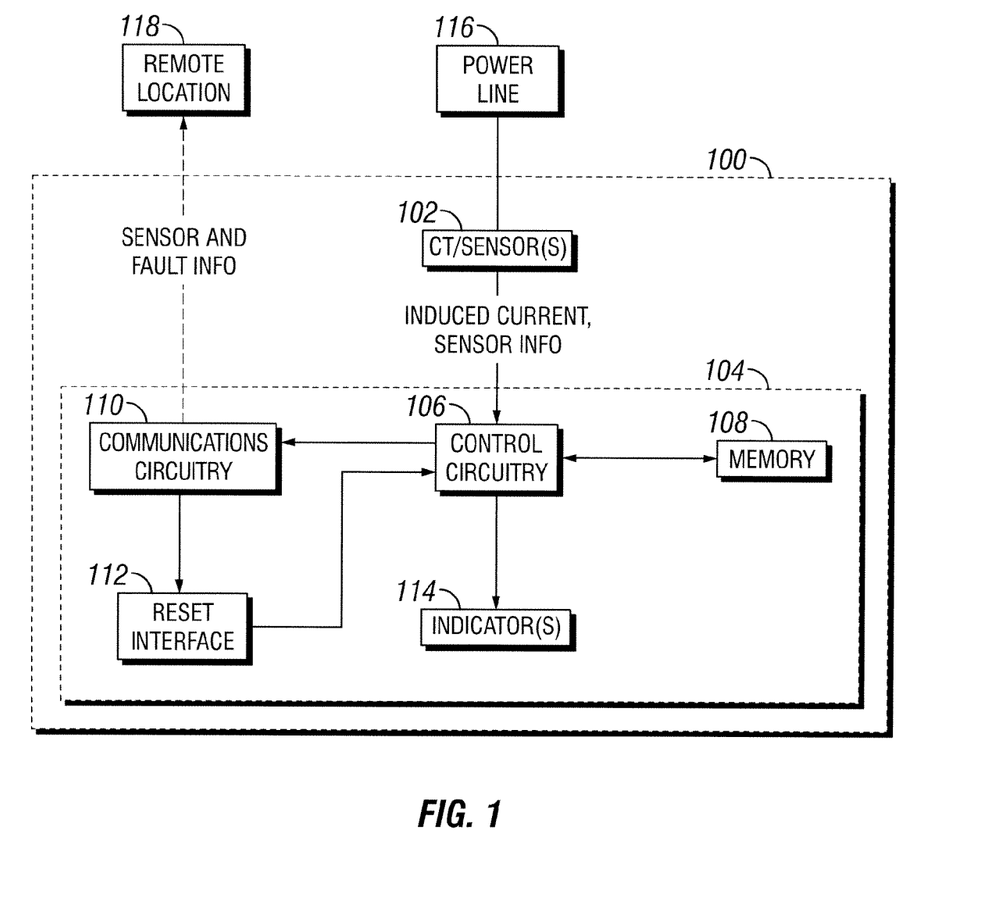
FIG. 1 illustrates a block diagram of a monitoring device according to an embodiment of the present invention.

FIG. 1 is a block diagram illustrating a monitoring device 100, in accordance with certain embodiments of the present invention. The monitoring device 100 includes CT and sensors 102 and circuitry 104 associated with the monitoring device. As an example of the circuitry 104 associated with the monitoring device, the circuitry 104 includes control circuitry 106, communications circuitry 110, a memory 108, a reset interface 112, and one or more indicators 114. It is noted that the circuitry 104 illustrated in FIG. 1 is provided as an example only, and the circuitry 104 may include additional circuitry or omit some or all of the components 106, 108, 110, 112, and 114.

Generally, as described in further detail below with reference to FIGS. 2A-2D, the monitoring device 100 may be securely attached to the power line 116 according to a clamping or other mechanical fixing means that ensures a strong mechanical connection between the monitoring device 100 and the power line 116. The term "power line" is used herein to refer to any type of electrical conductor that transmits electricity from one location to another. For example, the power line 116 may include one or more above or underground utility cables that carry and distribute electrical power.

The monitoring device is powered according to an induced current generated in an electrical wire winding of the CT, and the control circuitry 106 may include a pre-regulator circuit that receives the induced current from the CT and develops a voltage based on the induced current. The sensors measure conditions on the power line 116. For example, the sensors may measure a voltage and current present on the power line 116 in real time or near-real time. Among embodiments of the present invention, various types of sensors may be used to measure parameters related to conditions of the power line 116, conditions of the monitoring device 100, or the environment of the power line 116 and the monitoring device 100, such as line temperature, line tilt, ambient temperature, wind speed, liquid levels of electrical components, dissolved gas content or pressure from a monitored transformer, battery status, frequency, harmonics, zero crossings, vibration, and/or power factor. The sensors communicates measurements to the control circuitry 106 for processing. The control circuitry 106 may also store the measurements in the memory 108, provide external indications of the measurements via the indicators 114, and communicate the measurements via the communications circuitry 110.

In certain embodiments, the control circuitry 106 includes a microcontroller programmed to analyze sensor data and to respond according to various events or states. For example, the controller 104 may be configured to process and analyze sensor data, store the sensor data in the memory 108, transmit the sensor data to a remote location 118 via the communications circuitry 110, and provide one or more indications of the sensor data via the indicators 114. That is, the control circuitry 106 may be configured to provide an indication that a fault condition has occurred on the power line 116, based on sensor data.

The control circuitry 106 includes a regulated power supply that takes advantage of an optimal power point of the CT, which is based on a permeability of magnetic core material of the CT, the cross-sectional area of the magnetic core, the number of turns of the electrical wire winding wrapped around the magnetic core, the air gap separating the magnetic core halves, the resonant frequency of the circuit, and other factors such as a wire resistance of the electrical wire winding, switching efficiencies, and other electrical factors. Energy captured by the CT may be stored in an energy storage device such as one or more batteries or capacitors.

The indicators 114 may include one or more light emitting diodes (LEDs) or other indicators, and the indication may include lighting the LEDs to give notice to a field technician of the fault condition. Thus, the indicators 114 may provide a visible indication that a fault has occurred. In certain embodiments, the indicator comprises a high visibility display device, a liquid crystal display (LCD), or other similar display device. Additionally, the indicators 114 may emit an audible sound to alert a technician in a general vicinity that the monitoring device 100 has detected a fault condition.

The memory 108 may include any suitable persistent or semi-persistent memory, such as a flash-based or other type of memory. When the control circuitry 106 determines that sensor data should be recorded, such as when the sensor data indicates an unusual condition or fault, the control circuitry 106 may record the sensor data in the memory 108, along with a record of information related to the sensor data such as a time the sensor data was measured, the geographic coordinates of the monitoring device 100, ambient conditions at the time the sensor data was measured, or other similar data.

In certain embodiments, the memory 108 may also store information associated with the monitoring device 100. For example, upon installation, the memory 108 may be programmed with the global coordinates of the monitoring device 100. Alternatively, the memory 108 may store other identifying information, such as, but not limited to, a street address, a unique identifier of the monitoring device 100, utility grid coordinates, or an identifier of a nearby utility pole or other landmark.

The communications circuitry 110 includes circuitry configured to transmit data to the remote location 118. In some embodiments, the communications circuitry 110 communicates with the remote location 118 using cellular technologies such as GSM (Global System for Mobile communications) or CDMA (Code Division Multiple Access). The communications circuitry 110 may also comprise components for any number of wireless or wired communications protocols, including any of the 802.11 standards, Bluetooth (IEEE 802.15.1), ZigBee (IEEE 802.15.4), Internet Protocol, licensed or un-licensed radio, fiber, or power line carrier communications technologies.

The remote location 118 may be associated with a utility company's central office and includes the capability of simultaneously monitoring communication feeds from numerous monitoring devices 100 and communicating information from those feeds to an entity responsible for repair and maintenance of transmission and distribution systems. In this embodiment, the remote location 118 may comprise a central server connected to a utility company's outage management system. Upon receiving information indicating fault or sensor data from a monitoring device 100, the server processes and transmits the information to the outage management system. Either the server or the outage management system may also direct communications to the entity responsible for repair and maintenance systems associated with the fault or sensor data.

The reset interface 112 may include one or more reset operations, such as an indicator reset and a memory reset. In this context, the indicator reset operation removes a fault indication provided on the indicators 114, while the memory reset operation clears at least some sensor data from the memory 108. The memory reset operations may specify certain parameters to be cleared. For example, the memory reset operation may specify that only sensor data recorded before a certain date should be cleared, that all sensor data should be cleared, that sensor data and information relating to the monitoring device 100 should be cleared, that all data other than information relating to the monitoring device 100 should be cleared, and/or other similar parameters.

In certain embodiments, the control circuitry 106 may be programmed to respond to a correction of a previously identified fault event by executing an indicator reset operation but not a memory reset instruction. In this case, a record of the fault event, as well as the conditions that accompanied the fault event, will remain in memory 108 even though the indication of the fault is cleared from the indicators 114. Additionally, the reset interface 112 may receive a reset instruction directly from an "on-site" field technician via one or more buttons of the monitoring device 100, from an input device connected to the monitoring device 100, or from other similar input methods or devices.

Turning now to FIGS. 2A-2D, a physical structure of a monitoring device 200 according to one embodiment of the present invention is described in detail. As illustrated among FIGS. 2A-2D, the monitoring device 200 is configured to rest upon (i.e., hang from) an electrical conductor 202. The electrical conductor 202 may include a power or neutral line of an electricity distribution system, for example. According to aspects of the present invention, the monitoring device 200 is designed to be supportable by the electrical conductor 202, so that the monitoring device 200 may be safely and reliably supported by the electrical conductor 202.

Figure 2A:
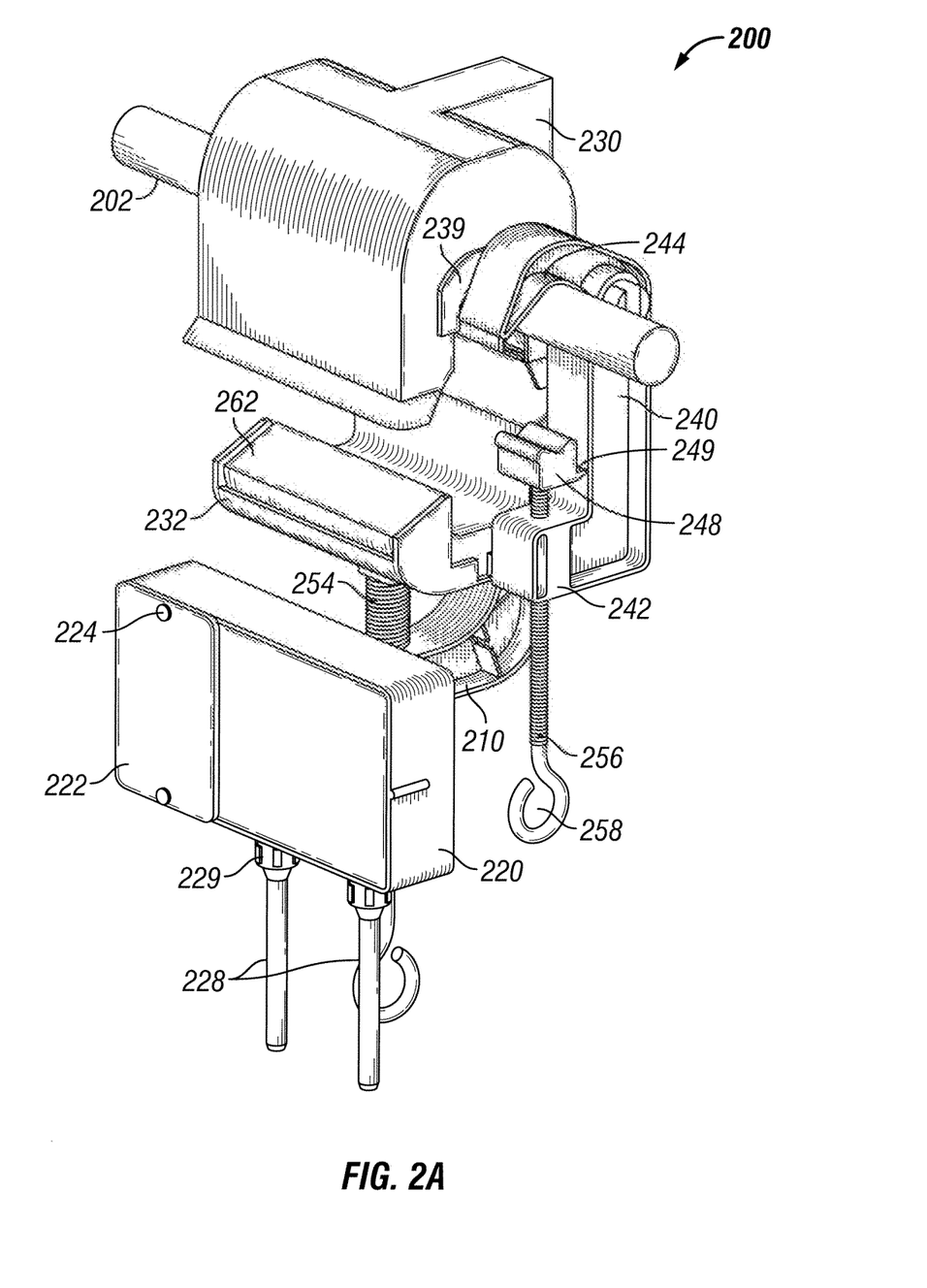
FIG. 2A illustrates a front view of a monitoring device in an open position according to an embodiment of the present invention.
Figure 2B:
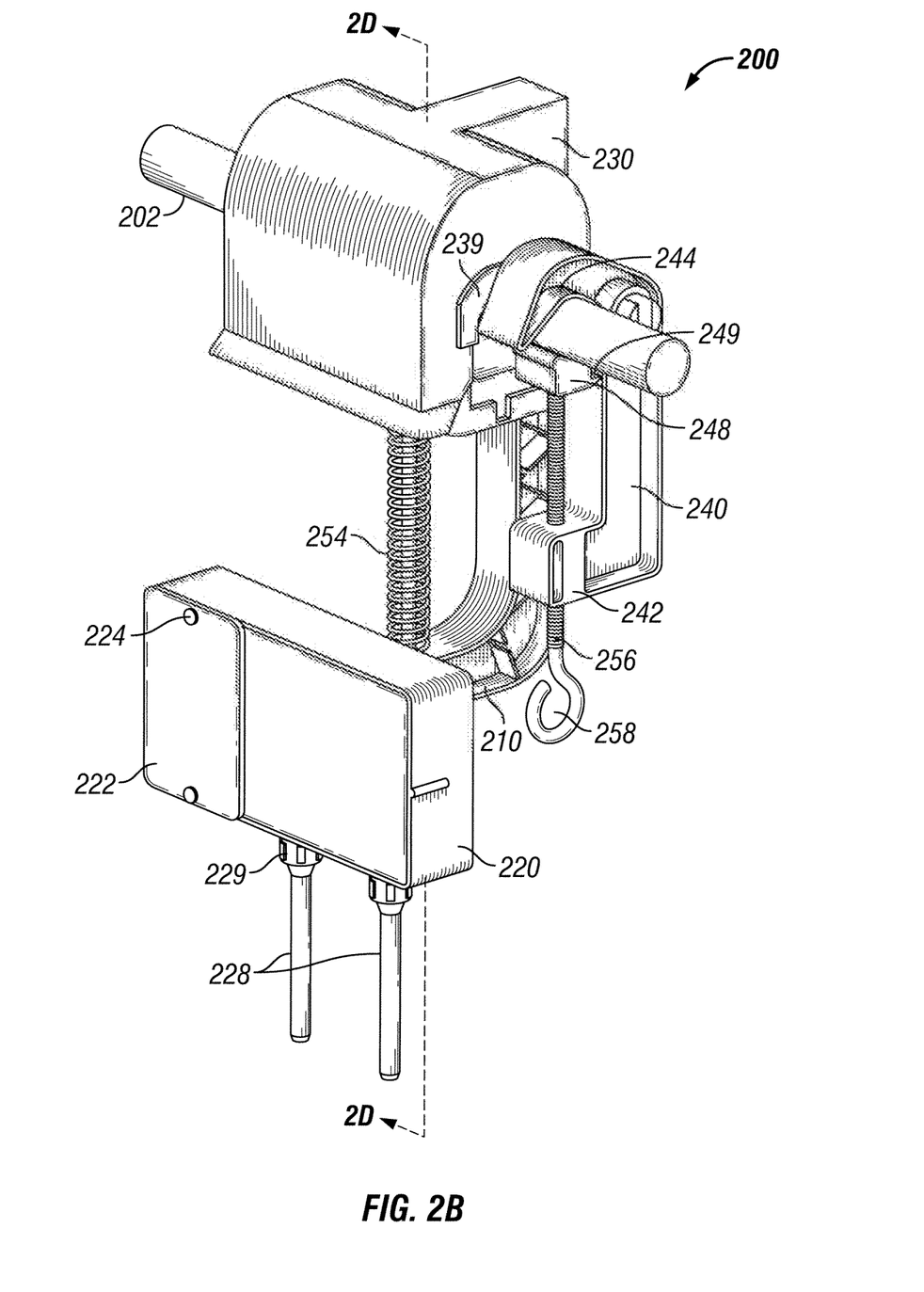
FIG. 2B illustrates a front view of a monitoring device in a closed position according to an embodiment of the present invention.
Figure 2C:
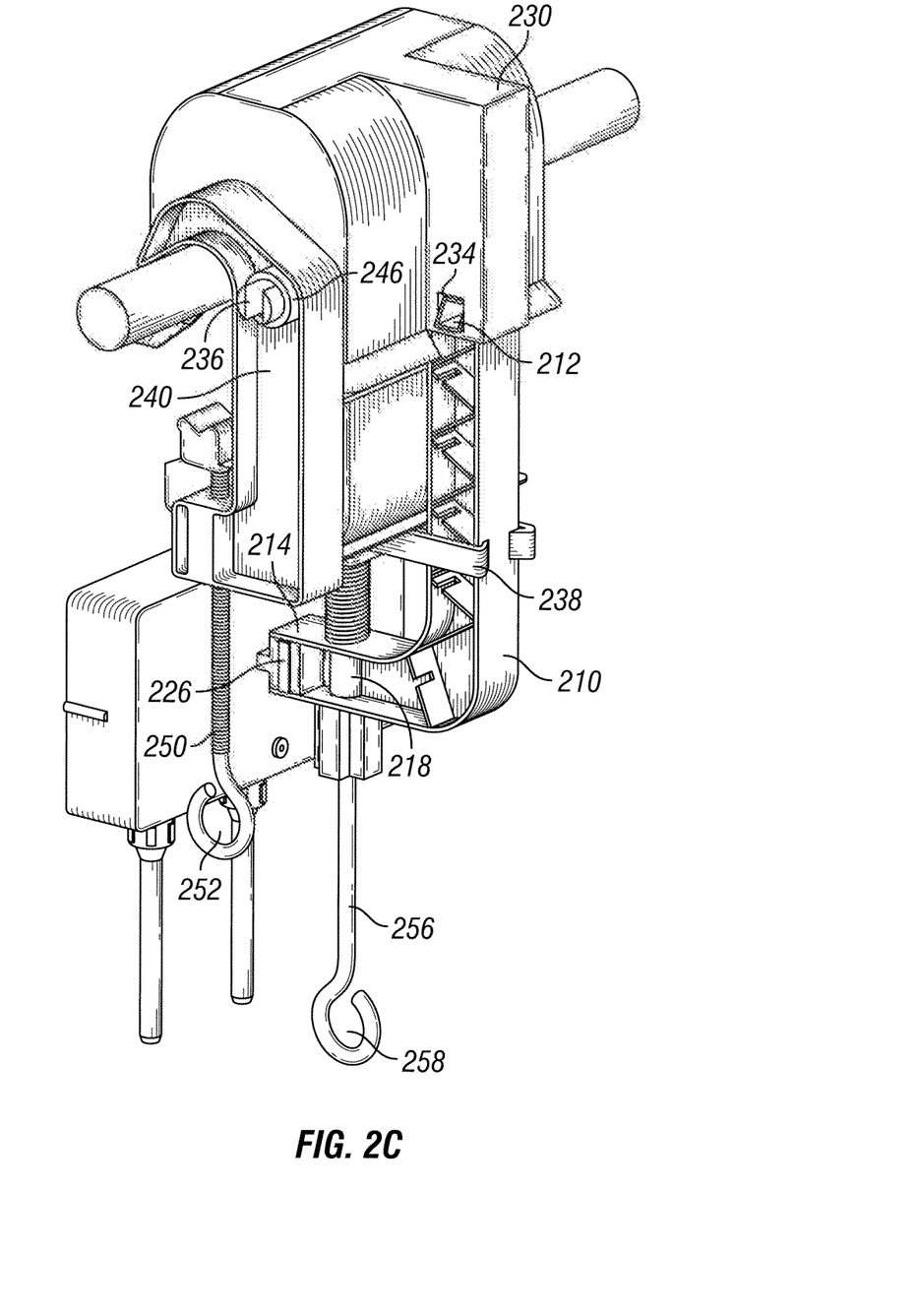
FIG. 2C illustrates a rear view of a monitoring device in an open position according to an embodiment of the present invention.
Figure 2D:
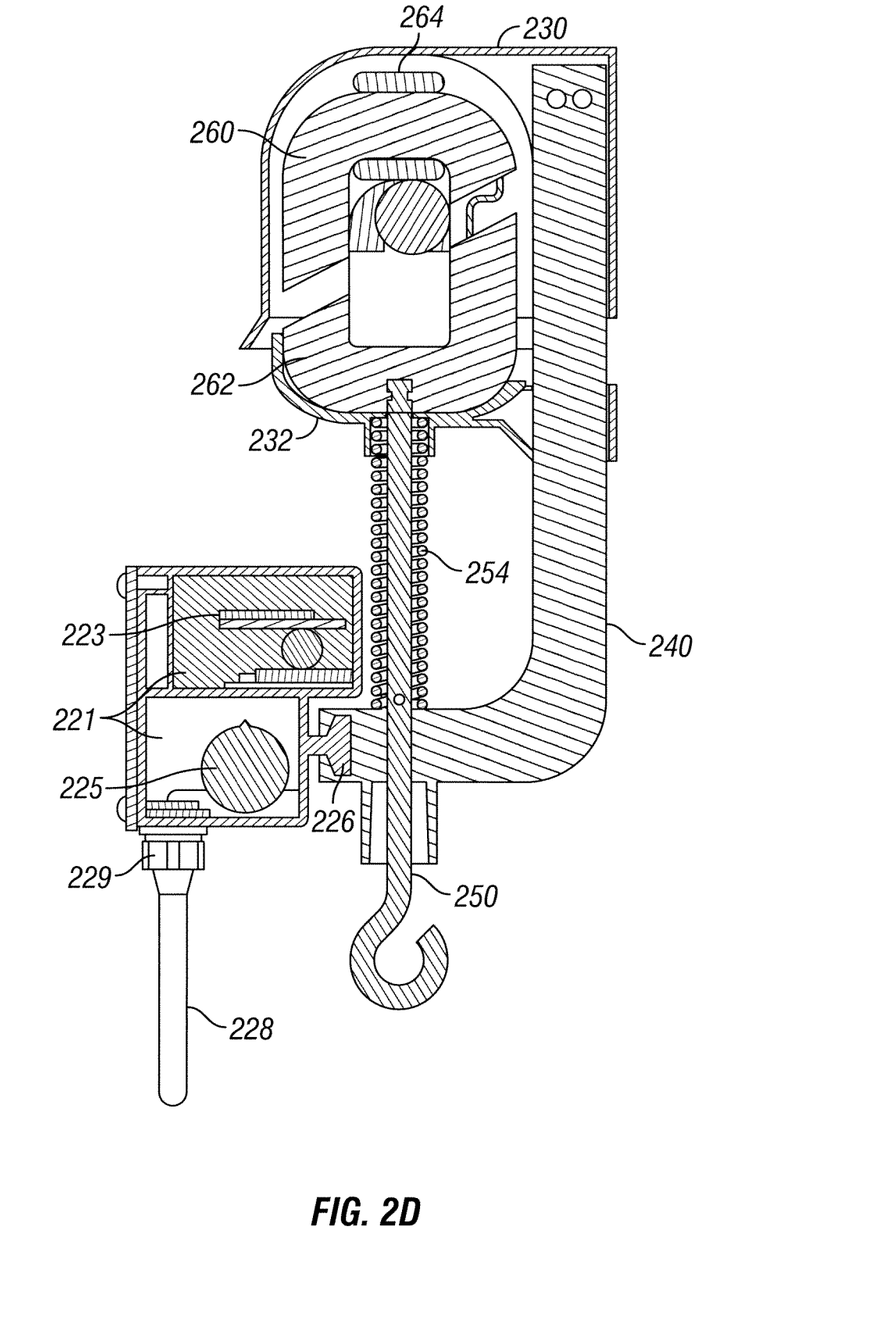
FIG. 2D illustrates a cross-sectional view of a monitoring device according to an embodiment of the present invention.

The monitoring device 200 includes an min 210, a housing 220, a CT top cover 230, a CT bottom cover 232, a wire clamp 240, a CT comprising various elements described below, and other additional elements, as described below and illustrated among FIGS. 2A-2D. With reference to FIG. 2D, which illustrates the cross-section 2D-2D designated in FIG. 2B, the housing 220 includes an internal cavity 221 in which various circuitry components 223, such as the circuitry 104, may be disposed. Additionally, the housing 220 may enclose a battery, capacitor, or other power storage device 225, to store power obtained by current induced in the CT. A person of ordinary skill in the art will recognize that the housing 220 may vary in shape and size depending upon requirements of the application of the monitoring device 200. The housing 220 may be constructed from any material suitable to withstand exposure to environmental conditions, such as a synthetic plastic or semi-synthetic plastic solid material or other material known in the art to be suitable for the application.

In certain embodiments, the housing 220 also includes an aperture 229 through which one or more antennas 228 may extend. The antennas 228 may be associated with the communications circuitry 110 discussed above. Although FIGS. 2A-2D illustrate two antennas 228, the housing 220 may include no antenna, one antenna, or more than two antennas. The housing 220 may additionally include indicators positioned or mounted external or semi-external to the housing 220, such as the indicators 114 described above with reference to FIG. 1. In this context, the indicators may be disposed upon an exterior of the housing 220 so as to be visible to a field technician.

The housing 220 is configured to enclose and protect the circuitry components 223 from mechanical shock, wind, rain, snow, hail, and other environmental conditions. To that end, the components 223 and other components enclosed with the housing 220 may be secured using a potting compound, glue, or any other fastening means known in the art to be suitable for the application. The housing 220 may include a housing cover 222, which is fastened to the housing 220 with fasteners 224, such as screws, plastic snaps, rivets, or other fastening means. Preferably, the housing 220 is designed to be weather-sealed to exclude elements of the environment. On one or more sides of the housing 220, the housing 220 includes a mounting tab 226 that projects from the housing 220. The mounting tab is formed to have one end adapted to fit into a mating recess 214 of the arm 210, as most clearly depicted in FIG. 2C. Alternative means to fasten the housing 220 to the arm 210 are encompassed by the present invention, as would be understood by one having skill in the art.

The CT top cover 230 may be fitted over the arm 210 and connected or attached to the arm 210 by snapping tabs 212 of the arm 210 into receptacles 234 of the CT top cover 230. The CT top cover 230 additionally includes a post 236 (see FIG. 2C) for connecting or attaching the wire clamp 240 to the CT top cover 230. It is noted that, in other embodiments, the wire clamp 240 may be attached to the arm 210 or other elements of the monitoring device 200. The CT top cover 230 secures a CT split core top 260 (see FIG. 2D) using a potting compound, glue, or other adhesive known in the art to be suitable for the application, or any mechanical means understood in the art to be suitable for the application. The CT top cover 230 may be formed using any material resistant to the environment, such as a synthetic plastic or semi-synthetic plastic solid material or other material known in the art to be suitable for the application.

The CT bottom cover 232 is connected to the arm 210 by a grip 238 (see FIG. 2C) projecting on one side of the CT bottom cover 232. The grip 238 attaches to the arm 210 and permits the CT bottom cover 232 to slide along an extended length of the arm 210, from an open position of the CT to a closed position of the CT. Based on movement of the CT bottom cover 232 along the arm 210, the CT of the monitoring device 200 is opened and closed. That is, in FIG. 2A, the CT of the monitoring device 200 is illustrated in the open position and, in FIG. 2B, the CT of the monitoring device 200 is illustrated in the closed position. As illustrated in FIG. 2C, the grip 238 may be formed at one end of the CT bottom cover 232 in a shape accommodating to the dimensions of the arm 210. After being formed, the grip 238 of the CT bottom cover 232 may be snapped over the arm 210, while permitting movement of the CT bottom cover 232 along the extended length of the arm 210. The grip 238 is one example of a means to attach the CT bottom cover 232 to the arm 210, although the present invention includes equivalents of the grip 238 as would be understood in the art. A CT split core bottom 262 is secured to the CT bottom cover 232 using a potting compound, glue, other adhesive known in the art to be suitable for the application, or any mechanical means understood in the art to be suitable for the application. The CT bottom cover 232 may be formed from any suitable material resistant to the environment, such as a synthetic plastic or semi-synthetic plastic solid material or other material known in the art to be suitable for the application.

As noted above, the monitoring device 100 includes a CT comprised of the CT split core top 260, the CT split core bottom 262, and an electrical wire winding 264, as best seen in FIG. 2D. The CT is formed, adapted, and configured to capture an induced current in the electrical wire winding 264 of the CT based on an alternating current conducted over the electrical conductor 202. The CT split core top 260 and bottom 262 comprise first and second portions of a magnetic core of the CT.

Current flowing through the conductor 202 generates a magnetic field that extends around the conductor 202, which couples to the magnetic core of the CT and induces a current in the electrical wire winding 264 of the CT that is directly proportional to the current flowing through the electrical conductor 202 and a number of turns of the electrical wire winding 264 around the CT split core top 260. It is noted that, alternatively, the electrical wire winding 264 may be wound or wrapped around the CT split core bottom 262 or around both the CT split core top 260 and bottom 262. It is further noted that the CT includes both a primary winding and a secondary winding. That is, as depicted in FIGS. 2A-2D, the electrical conductor 202 and electrical wire winding 264 act as primary and secondary windings, respectively. An electrical connector (not shown) routes a current induced in the electrical wire winding 264 to the housing 220. Among embodiments of the present invention, the electrical connector may be flexible or disposed in a rigid structure, such as a conduit, that protects the electrical connector. Thus, the housing 202 may be additionally adapted to receive the electrical connector, without compromising the integrity of the housing 220 or any circuitry disposed within the housing 220.

It is noted that, although FIGS. 2A-2D illustrate a division of the magnetic core of the CT into the CT split core top 260 and bottom 262 sections, the magnetic core may be split at various other angles and positions, such that the CT split core top 260 and bottom 262 may vary in shape. In one embodiment, the magnetic core of the CT is formed by winding layers of metal around a magnetic form, such as a mandrel, to form a core, and splitting the core into sections. The magnetic core of the CT comprises a magnetic core material such as grain-oriented steel, supermalloy, permalloy, ferrites, combinations thereof, and/or other materials known in the art to be suitable for the application of magnetic core material. In some embodiments, the magnetic core may further include an epoxy or other coating to seal and protect the magnetic core from the environment. The core may be coated with epoxy either before or after being split into the top 260 and bottom 262 sections. Further, the core may be vacuum-impregnated with a varnish approximately 0.2 to 0.6 mil thick, for example, to hold laminations of the core together and protect the core from moisture. In one embodiment, the core is designed for use at an operational frequency of 60 Hz, although the core may be designed for use at other operational frequencies.

In some embodiments, a reference voltage of the circuitry 223 is brought to the voltage potential of the electrical conductor 202, by an electrical coupling between the circuitry 223 and the electrical conductor 202. In this manner, a substantially equal voltage potential and electric field between the electrical conductor 202 and the circuitry 223 permits the monitoring device 202 to communicate wirelessly with reduced noise and interference. A person of ordinary skill in the art having the benefit of the present disclosure will recognize an appropriate means to bring the circuitry 223 to the line potential of the electrical conductor 202 without departing from the spirit and scope of the invention. For example, one or more electrically conductive wires, pins, or other members could be used.

When a field technician mounts the monitoring device 200 to the electrical conductor 202, the voltage potential of the monitoring device 200 changes to the voltage potential of the electrical conductor 202. Generally, change in voltage potential is significant. An abrupt change in voltage potential can cause arcing between the monitoring device 200 and the electrical conductor 202, which can be harmful to the monitoring device 202. Thus, in certain embodiments, a pad of semi-conductive or resistive material 239 (see FIG. 2B) may be fixed to the CT split core top 260 at a position where the electrical conductor 202 rests upon the CT split core top 260, to reduce or slow a change in electrical potential between the monitoring device 200 and the electrical conductor 202 when the monitoring device 200 is secured to the electrical conductor 202. In one embodiment, the pad 239 comprises an elongated sheet of electrically resistive semi-conductive material. For example, the pad 239 may have an electrical resistance of between about 7 and 40 Ohms/cm. Slowing the rate of change of voltage potential difference between the monitoring device 200 and the electrical conductor 202 decreases or eliminates the likelihood of electrical arcing or corona discharge when securing the monitoring device 200 to the electrical conductor 202. As described above, certain aspects of the present invention include providing a ground reference point for the circuitry enclosed in the housing 220 based on an electrical coupling to the conductor 202. To this end, the ground reference point of the circuitry enclosed in the housing 220 may be coupled to the conductor 202 via the pad of semi-conductive material 239.

The CT rod 250 is attached to a bottom of the CT bottom cover 232 so that the CT bottom cover 232 may be positioned along the arm 210, as guided by the grip 238, according to actuation of the CT rod 250. Thus, both the CT bottom cover 232 and the CT split core bottom 262 are adjustable with respect to the remaining elements of the monitoring device 200, in at least one axis or dimension of motion. That is, the CT split core bottom 262 may be moved with respect to the CT split core top 260 based upon movement of the CT rod 250 connected to the CT bottom cover 232. Thus, the CT split core bottom 260 and the CT split core bottom 262 may be placed into proximity surrounding the electrical conductor 202 so that magnetic flux from the conductor 202 may be strongly coupled into the magnetic core of the CT and, hence, the electrical wire winding 264.

The CT rod 250 passes through a through-hole 218 in a lower portion of the arm 210 and through a CT rod spring 254. The CT rod spring 254 surrounds the CT rod 250 between the arm 210 and the CT bottom cover 232, according to one embodiment. The CT rod spring 254 spring biases the CT bottom cover 232 and CT split core bottom 262 to a closed position with the CT top cover 230 and the CT split core top 260. When in the closed position, a small air gap may exist between the CT split core bottom 262 and the CT split core top 260. As best illustrated in FIG. 2D, the CT rod 250 is attached or fastened to the CT bottom cover 232 at one end and includes a CT rod eye 252 at another end. Using a hotstick, a field technician may slide, move, or actuate the CT rod 250 by hooking an appropriate tool mounted on an end of the hotstick into the CT rod eye 252. Then, the field technician can pull the CT rod 250 to compress the CT rod spring 254 and open the CT split core top 260 and CT split core bottom 262 sections. In this position, the monitoring device may be positioned such that the electrical conductor 202 enters a cavity within the CT split core top 260 and bottom 262 sections, as illustrated among FIGS. 2A-2D. A person of ordinary skill in the art having the benefit of the present disclosure will recognize that the CT rod eye 252 may have a number of different shapes and configurations.

According to various embodiments of the present invention, the travel distance of the CT rod 250 may vary depending upon the size of the monitoring device 200, the size and shape of the CT rod spring 254, and a spring coefficient or stiffness of the CT rod spring 254. Additionally, the spring coefficient or stiffness of the CT rod spring 254 will determine how tightly or stiffly the CT split core top 260 and bottom 262 sections are held together in the closed position. Accordingly, the size and spring coefficient or stiffness of the CT rod spring 254 may be selected based upon known conditions and/or empirically based on results in the field.

The wire clamp 240 clamps to and secures the monitoring device 200 to the electrical conductor 202. As illustrated among FIGS. 2A-2D, the wire clamp 240 is formed in a substantial "C" shape, although the present invention includes other shapes of the wire clamp 240. The wire clamp 240 includes a curved conductor receptacle 244 formed at one end to rest upon the electrical conductor 202 and secure the monitoring device 200 to the electrical conductor 202. A preferred size and shape of the conductor receptacle 244 may be selected according to a diameter of the conductor 202, for example, or based on other considerations. The wire clamp 240 securely attaches the monitoring device 200 to the electrical conductor 202 by compressing the electrical conductor 202 between the conductor receptacle 244 and a tooth 248 connected at one end of a wire clamp rod 256, as described in further detail below. The tooth 248 includes an anti-rotation/stabilization tab 249 to prevent the tooth 248 from rotating with respect to the wire clamp 240 and the electrical conductor and to maintain the tooth 248 in an appropriate position to securely press the electrical conductor 202 into the conductor receptacle 244. The wire clamp 240 also includes a post through-hole 246 to accept the post 236 projecting perpendicularly from the CT top cover 230, as illustrated in FIG. 2C. The wire clamp 240 is thus attached or fastened to the CT top cover 230, while permitting the wire clamp 240 to pivot with respect to the CT top cover 230 and the monitoring device 200.

The wire clamp rod 256 passes through a through-hole 242 (see FIG. 2B) in the wire clamp 240. At one end of the wire clamp rod 256, the tooth 248 is fastened, and a wire clamp rod eye 258 is formed at another end of the wire clamp rod 256. In one embodiment, the wire clamp rod 256 and through-hole 242 are threaded, and the tooth 248 may be adjusted to secure the electrical conductor 202 to the conductor receptacle 244 based on twisting or rotating the wire clamp rod 256 using the wire clamp rod eye 258 and a hotstick. In another embodiment, a wire clamp rod spring may be disposed between a base of the wire clamp 240 and the tooth 248. Thus, the tooth 248 may be spring biased by the clamp rod spring to push the tooth 248 to a closed position at rest, pressing and securing the electrical conductor 202 into the conductor receptacle 244. Additionally, in alternate embodiments, the CT rod 250 may be threaded and the CT bottom cover 232 and CT split core bottom 262 may be moved into a closed position based on twisting or rotating the CT rod 250 using the CT rod eye 252 and a hotstick. In certain embodiments, the CT rod spring 254 may be omitted. It is noted that the wire clamp 240 secures the monitoring device such that the monitoring device is resistant to being unsecured from the electrical conductor 202 due to wind, rain, hail, or other environmental features.

The monitoring device 202 may be secured to the electrical conductor 202 by adjusting or moving the CT rod 250 to open the CT, and positioning the monitoring device 200 upon the electrical conductor 202 so that the weight of the monitoring device 200 rests upon the electrical conductor 202. The CT rod 250 may then be released after the weight of the monitoring device 200 is rested upon the electrical conductor 202. Afterwards, the wire clamp rod 256 may be adjusted or twisted to secure the monitoring device 200 to the electrical conductor 202 using the wire clamp 240. It is noted that the monitoring device 200 may be secured to the electrical conductor 202 without de-energizing the electrical conductor 202, using a hotstick as described above.

Figure 3:
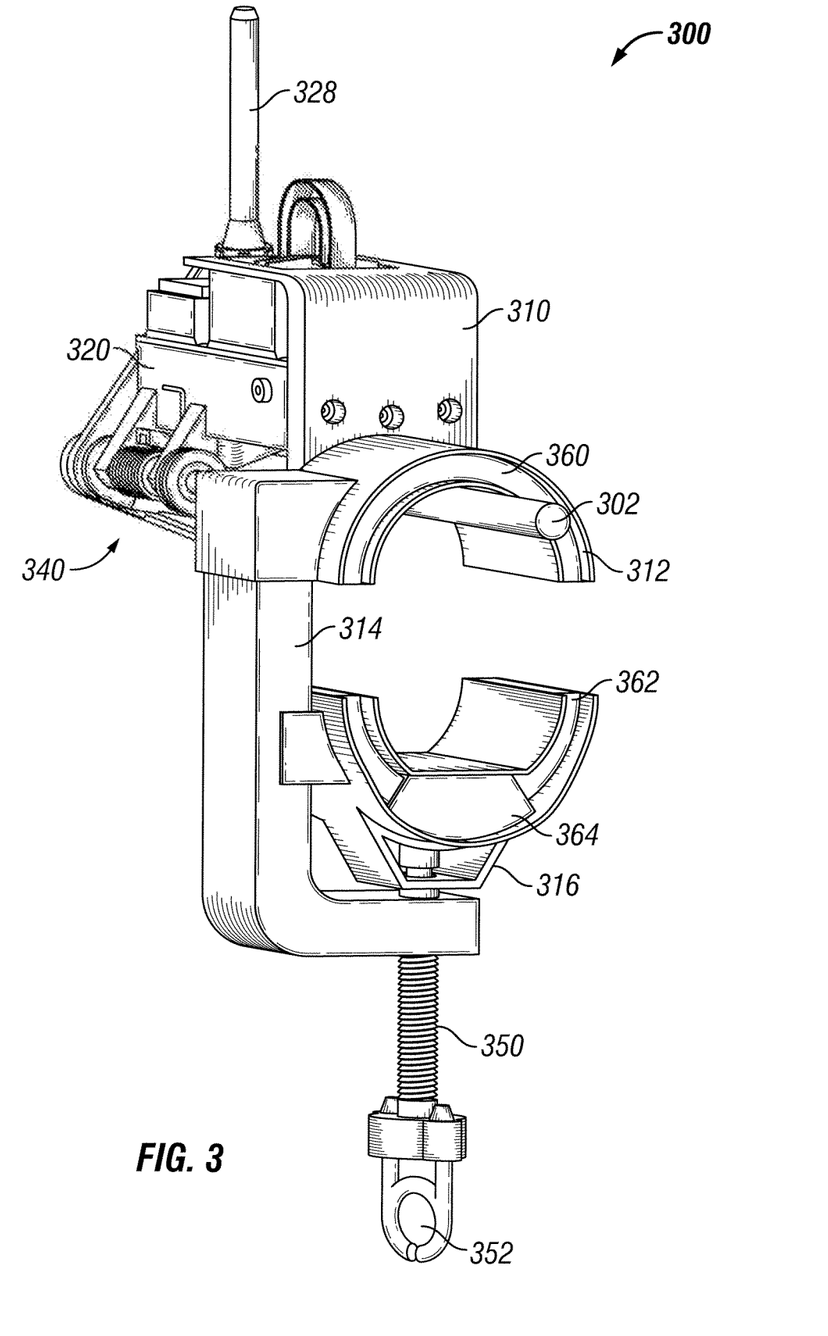
FIG. 3 illustrates a monitoring device according to another embodiment of the present invention.

Turning to FIG. 3, a monitoring device 300 according to an alternative embodiment is described in detail. The monitoring device 300 is similar in function to the monitoring device 400, but having an alternative design for securing to an electrical conductor and an alternative design for opening and closing a CT. The monitoring device 300 includes an upper CT clamp 312, a CT clamp arm 314, a lower CT clamp 316, housing 320, a wire clamp 340, and other elements described below.

A CT clamp bracket 310 secures the upper CT clamp 312 to the housing 320. The CT clamp bracket 310 may be secured to the housing 320 using mechanical fasteners or other means suitable for the application. The upper CT clamp 312 houses the CT split core top 360, which is similar to the CT split core top 260, illustrated among FIGS. 2A-2D. The CT clamp arm 314 is attached to the CT clamp bracket 310, and the lower CT clamp 316 is attached to the CT clamp arm 314. The lower CT clamp 316 houses the CT split core bottom 362, which is similar to the CT split core bottom 262 illustrated among FIGS. 2A-2D. A wiring 364 is wound around the CT split core bottom 362, so that a current may be induced in the wiring 364 from the electrical conductor 302, and the current induced in the wiring 364 may be used to power the circuitry disposed within the housing 320.

The housing 320 includes an internal cavity for enclosing various circuitry, such as the circuitry 104, and is similar to the housing 220 described above with reference to FIGS. 2A-2D. In certain embodiments, the housing 320 also includes an aperture through which one or more antennas 328 may extend. The antennas 328 may be associated with the communications circuitry 110 discussed above. Alternatively, the housing 320 may include no antenna or more than one antenna. The housing 320 may additionally include indicators (not shown) positioned or mounted external or semi-external to the housing 320, such as the indicators 114 described above with reference to FIG. 1.

The wire clamp 340 secures the monitoring device 300 to the electrical conductor 302. Although the function of the wire clamp 340 is similar to the function of the wire clamp 240, the wire clamp 340 relies upon an alternative means to secure the monitoring device 300 to the electrical conductor 302. In certain aspects, the wire clamp 340 is similar to the clamping mechanism 630 described in U.S. patent application Ser. Nos. 12/569,343 and 12/569,446.

In one embodiment, the clamp rod 350 includes a thread around the clamp rod 350, so that the clamp rod 350 may be twisted or rotated to move the lower CT clamp 316 and the CT split core bottom 362 into a closed position with respect to the upper CT clamp 312 and CT split core top 360. The clamp rod 350 may be twisted or rotated using a hotstick and the clamp rod eye 352. Alternatively, the clamp rod 350 may be unthreaded, and a spring similar to spring 254 may be disposed between the CT clamp arm 314 and the lower CT clamp 316.

In some aspects, the monitoring device 300 is similar to the monitoring device 610 disclosed in U.S. patent application Ser. Nos. 12/569,343 and 12/569,446, except that the CT split core top 360 and CT split core bottom 362 in the monitoring device 300 are disposed within the upper CT clamp 312 and the lower CT clamp 316 and are opened and closed using the threaded CT clamp rod 350.

Figure 4:
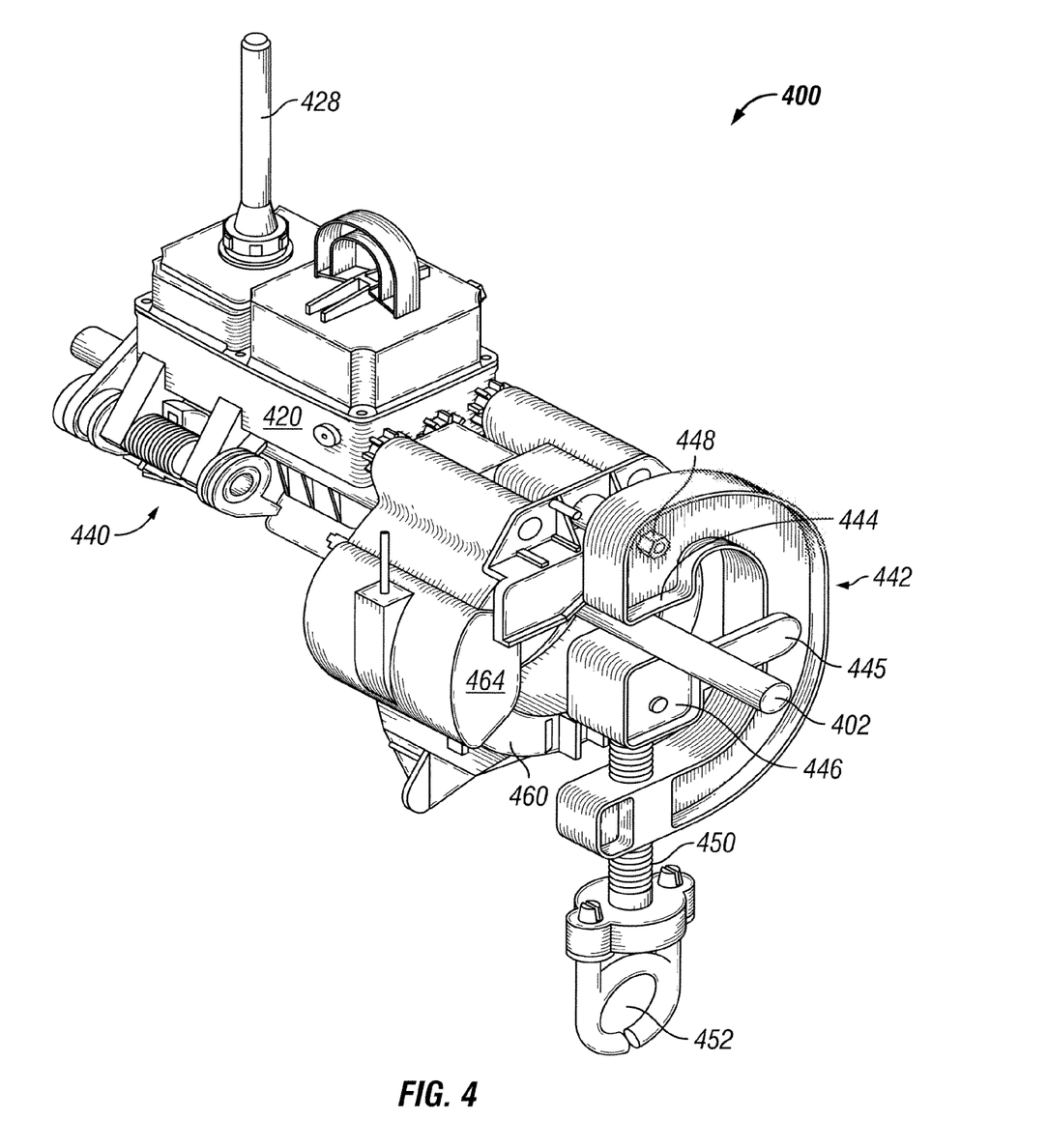
FIG. 4 illustrates a monitoring device according to another embodiment of the present invention.

Turning to FIG. 4, a monitoring device 400 according to another alternative embodiment is described in detail. It is noted that the monitoring device 400 is similar to the monitoring device 610 disclosed in U.S. patent application Ser. Nos. 12/569,343 and 12/569,446. It is further noted, however, that the monitoring device 400 described herein further includes the auxiliary wire clamp 442.

According to FIG. 4, the monitoring device 400 includes a split core CT 460, a housing 420, a wire clamp 440, an auxiliary wire clamp 442, and other elements described below. As compared to the monitoring device 600 described in U.S. patent application Ser. Nos. 12/569,343 and 12/569,446, the monitoring device 400 illustrated in FIG. 4 additionally includes the auxiliary wire clamp 442 to additionally secure the monitoring device 400 to the electrical connector 402. In certain aspects, the split core CT 460 is similar to the CT 610 described in U.S. patent application Ser. Nos. 12/569,343 and 12/569,446, and the wire clamp 440 is similar to the clamping mechanism 630 described in U.S. patent application Ser. Nos. 12/569,343 and 12/569,446. A wiring 464 is wound around at least a portion of the split core CT 460, so that a current may be induced in the wiring 464 from the electrical conductor 402, and the current induced in the wiring 464 may be used to power the circuitry disposed within the housing 420.

The housing 420 includes an internal cavity to enclose various circuitry such as the circuitry 104, and is similar to the housing 220 described above with reference to FIGS. 2A-2D. In certain embodiments, the housing 420 also includes an aperture through which one or more antennas 428 may extend. The antennas 428 may be associated with the communications circuitry 110 discussed above. Alternatively, the housing 420 may include no antenna or more than one antennas. The housing 420 may additionally include indicators (not shown) positioned or mounted external or semi-external to the housing 420, such as the indicators 114 described above with reference to FIG. 1.

The wire clamp 440 secures the monitoring device 400 to the electrical conductor 402. Additionally, the auxiliary wire clamp 442 further secures the monitoring device 400 to the electrical conductor. In this manner, the monitoring device 400 may be reliably secured to the electrical conductor 402. According to one embodiment, the auxiliary wire clamp 442 is attached to the split core CT 460 by a pin, screw, or other fastener 448 that permits the auxiliary wire clamp 442 to rotate with respect to the split core CT 460 and the remaining elements of the monitoring device 400.

The auxiliary wire clamp 442 includes a clamp tooth 446 attached at one end of a clamp rod 450, a clamp tooth 446 attached at one end of the clamp rod 450, and an anti-rotation/stabilization tab 445 that functions similarly as the tab 249 described above with reference to FIG. 2A. In one embodiment, the clamp rod 450 includes a thread around the clamp rod 450, so that the clamp rod 450 may be twisted or rotated by an eye 452 using a hotstick, to secure the electrical conductor 402 between a conductor receptacle 444 of the auxiliary wire clamp 442 and the clamp tooth 446. Alternatively, the clamp rod 450 may be un-threaded, and a spring similar to spring 254 may be disposed between a bottom of the auxiliary wire clamp 442 and the clamp tooth 446.

Figure 5:
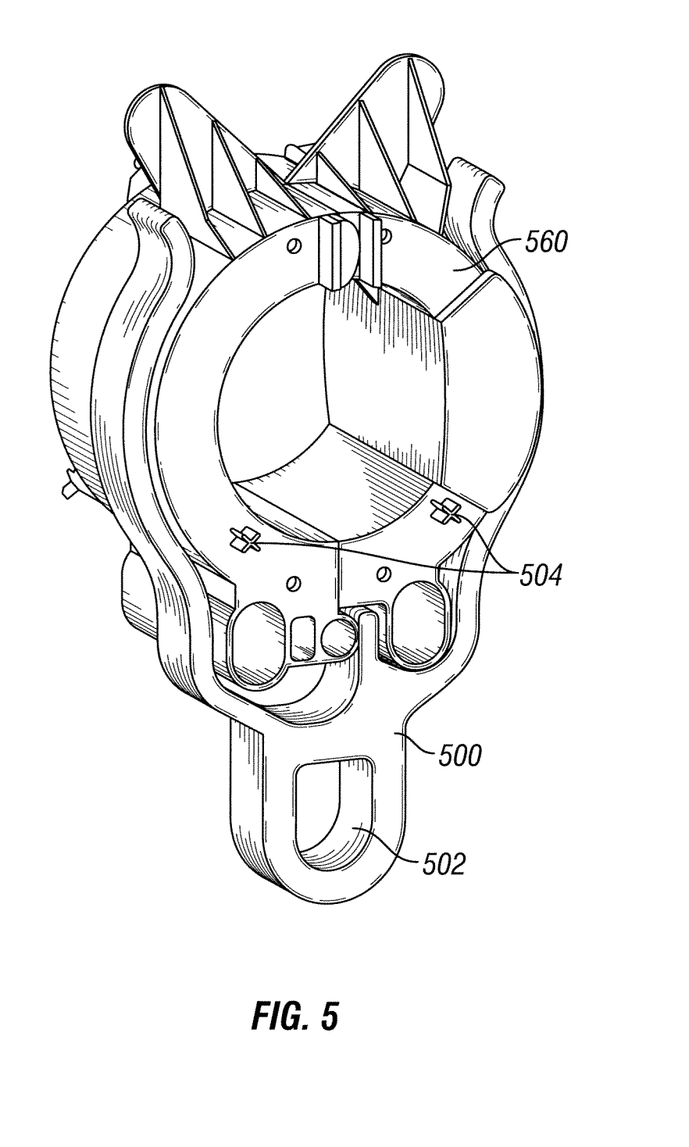
FIG. 5 illustrates a current transformer clip according to an embodiment the present invention.

Turning to FIG. 5, a clip 500 is illustrated. The clip 500 is formed to be used with a monitoring device such as the monitoring device 400 including a split core CT. As illustrated, the clip 500 may be used in association with split core CT 560, which is similar to the split core CT 460, to secure the split core CT 560 in a closed position. That is, upon a field technician securing a monitoring device including the split core CT 560 to an electrical conductor, the field technician may additionally place the clip 500 over the split core CT 560 using the clip eye 502 and a hotstick, to prevent the split core CT 560 from opening and releasing the electrical conductor. It is noted that, as described with regard to the CT 610 of U.S. patent application Ser. Nos. 12/569,343 and 12/569,444, the split core CT 560 may be spring biased to a closed position by springs (not shown) attached to spring posts 504. Thus, the clip 500 is designed to be clipped over the split core CT 560 to secure the split core CT 560 in addition to the spring bias. The clip 500 may be formed from any material having tensile strength suitable for the application, such as a synthetic plastic or semi-synthetic plastic solid material or other material known in the art to be suitable for the application.

Although specific embodiments have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent steps corresponding to, the disclosed aspects of the exemplary embodiments, in addition to those described above, can be made by a person of ordinary skill in the art, having the benefit of this disclosure, without departing from the spirit and scope of the invention defined in the following claims, the scope of which is to be accorded the broadest interpretation so as to encompass such modifications and equivalent structures.

What is claimed is:

1. An apparatus for securing to and collecting power from an electrical conductor, comprising:
   a top cover that secures and covers a top core of a split core current transformer ("CT"), the CT collecting power from the electrical conductor;
   a bottom cover that secures and covers a bottom core of the split core CT;
   a wire clamp that clamps to and secures the apparatus to the electrical conductor;
   a housing coupled to and suspended from the apparatus, the housing including an internal cavity that encloses circuitry associated with the apparatus, wherein the CT is external to the housing; and
   an arm that adjoins the housing, the top cover, and the bottom cover, wherein the bottom cover is slidable along a length of the arm, and wherein a CT adjustment rod is disposed through a portion of the arm.

2. The apparatus of claim 1, wherein
   the CT adjustment rod is fastened to the bottom cover at one end and passes through a CT rod spring and a through-hole in the arm, wherein
   the CT rod spring surrounds the CT adjustment rod between the arm and the bottom cover and provides a spring bias that maintains the top and bottom covers and the top and bottom cores of the CT in a closed position.

3. The apparatus of claim 2, wherein another end of the CT adjustment rod includes an adjustment eye for moving the CT rod against the spring bias to open the top and bottom covers and the top and bottom cores of the CT.

4. The apparatus of claim 1, further comprising
   a wire clamp rod passing through a through-hole in the wire clamp; and
   a tooth fastened at one end of the wire clamp rod for securing the electrical conductor by the wire clamp.

5. The apparatus of claim 4, wherein another end of the wire clamp rod includes an adjustment eye for twisting the wire clamp rod to un-secure the apparatus from the electrical conductor.

6. The apparatus of claim 1, wherein the top cover includes a post extending from one side, the wire clamp includes a post through-hole, and the post of the top cover is disposed through the post through-hole of the wire clamp to fasten the wire clamp to the top cover.

7. The apparatus of claim 6, wherein the wire clamp is formed to pivot about the post of the top cover with respect to the top cover, the bottom cover, the housing, and the arm.

8. The apparatus of claim 1, further including a winding wrapped around a portion of one of the top and bottom cores, a magnetic field generated by an alternating current in the electrical conductor being coupled to the winding and inducing a current in the winding.

9. The apparatus of claim 8, further comprising
circuitry disposed in the internal cavity of the housing that converts the current induced in the winding into power for sensing and measuring conditions of the electric conductor, wherein the conditions include a fault condition.

10. The apparatus of claim 9, wherein
the circuitry disposed in the internal cavity of the housing includes a ground point electrically coupled to the electrical conductor.

11. A method for securing to and collecting power from an electrical conductor, comprising:
adjusting a current transformer ("CT") clamp rod to open a CT;
positioning the CT to a position resting upon the electrical conductor;
adjusting a wire clamp rod to open a wire clamp;
positioning the wire clamp and wire clamp rod such that the wire clamp clamps the electrical conductor, wherein
the wire clamp and the CT comprise elements of a monitoring device, and
the monitoring device comprises a housing coupled to or suspended from the monitoring device and enclosing circuitry associated with the monitoring device, a top cover that covers a top core of the CT, a bottom cover that covers a bottom core of the CT, and an arm that adjoins the housing, the top cover, and the bottom cover, wherein the bottom cover is slidable along a length of the arm, the arm having an adjustment rod disposed therethrough, and wherein the CT is external to the housing.

\* \* \* \* \*